(12) United States Patent
Seeber

(10) Patent No.: US 6,900,637 B1
(45) Date of Patent: May 31, 2005

(54) PHASED ARRAY COIL WITH CENTER SHIFTED SENSITIVITY

(75) Inventor: Derek A. Seeber, Wauwatosa, WI (US)

(73) Assignee: IGC Medical Advances, Inc., Milwaukee, WI (US)

( * ) Notice: Subject to any disclaimer, the term of this patent is extended or adjusted under 35 U.S.C. 154(b) by 0 days.

(21) Appl. No.: 10/804,869

(22) Filed: Mar. 19, 2004

(51) Int. Cl.[7] ............................................... G01V 3/00
(52) U.S. Cl. ..................................... 324/318; 324/309
(58) Field of Search ................................. 324/318, 319, 324/309, 307, 300, 322; 600/422

(56) References Cited

U.S. PATENT DOCUMENTS

| 5,361,765 | A | | 11/1994 | Herlihy et al. ............ 128/653.5 |
| 5,594,337 | A | | 1/1997 | Boskamp ..................... 324/318 |
| 5,664,568 | A | * | 9/1997 | Srinivasan et al. ......... 600/422 |
| 6,029,082 | A | * | 2/2000 | Srinivasan et al. ......... 324/318 |
| 6,784,665 | B1 | * | 8/2004 | Chan et al. .................. 324/318 |

* cited by examiner

Primary Examiner—Brij B. Shrivastav
(74) Attorney, Agent, or Firm—Quarles & Brady LLP

(57) ABSTRACT

A phase array coil uses asymmetric loops and selective overlapping to provide a more uniform field sensitivity to magnetic flux passing through the surface defined by multiple such phased array loops.

15 Claims, 1 Drawing Sheet

PHASED ARRAY COIL WITH CENTER SHIFTED SENSITIVITY

CROSS-REFERENCE TO RELATED APPLICATIONS

--

STATEMENT REGARDING FEDERALLY SPONSORED RESEARCH OR DEVELOPMENT

--

BACKGROUND OF THE INVENTION

The field of the invention is magnetic resonance imaging and in particular a local coil for use in magnetic resonance imaging.

Magnetic resonance imaging ("MRI") provides images, for example, of a human patient, by detecting faint signals from precessing hydrogen protons under the influence of a strong magnetic field (termed the $B_0$ field) after a radio frequency excitation.

The quality of the image produced by MRI is strongly dependent upon the strength of the received signal. For this reason, it is known to use radio frequency receiving coils placed in close proximity to the volume being imaged. Such coils are called local coils.

A particular type of local coil, termed a "phased array coil", provides a series of small loops that together define a surface covering a region of interest. Magnetic flux from NMR signals within the region of interest passes through the surface defined by the loops and is detected separately at each loop. The relatively smaller area of the loops provide improved signal-to-noise ratio, better spatial localization for certain MRI techniques, and extended coverage of the patient made possible by switching different sets of loops into communication with limited MRI machine inputs.

In order to ensure continuous coverage of a region of interest, the constituent loops of a phased array coil are normally placed in close proximity. This proximity promotes a coupling between the loops that reduces signal-to-noise ratio in the received NMR signal. For this reason, the coupling is normally reduced by one of several isolation techniques.

In a first decoupling method, a slight but precise overlap of the loops is created to promote a "flux sharing" of countervailing flux between the loops sufficient to decouple the coils from each other. This technique is described in U.S. Pat. No. 5,256,971 assigned to the assignee of the present invention and hereby incorporated by reference.

Decoupling coils by flux sharing can be difficult in practice because the amount of overlap must be precisely controlled and can change depending on the imaging environment. Accordingly, second methods of decoupling may be used instead or in addition to flux sharing, such methods including the use of networks of decoupling capacitors and/or the use of preamplifiers with input impedances selected to reduce current flow in the loops.

Despite many advantages of phased array coils, uniform sensitivity over the surface covered by the loops is hard to obtain because of a drop-off in sensitivity of the loops at their edges. In coils employing symmetric patterns of loops, the drop off may be most pronounced at the center of body structure where sharp imaging and high signal-to-noise ratio signals are required.

BRIEF SUMMARY OF THE INVENTION

The present inventors have realized that the patterns of sensitivity of individual loops of phased array coils may be shifted to eliminate low signal strength regions in combinations of these loops, particularly at the centers of interfaces of such loops. This shifting is accomplished by transforming the loops from their typical symmetric outline to an asymmetric shape. The asymmetry can be used to move the peak sensitivity pattern of the coil toward its interface with other loops.

For example, for a phased array coil of four loops, asymmetry in the loops may be used to shift the sensitivity of each loop toward the common center of the array counteracting a normal falloff of signals in this area. This technique may be used with or without selective overlap of the coils.

Specifically then, the present invention provides a phased array local coil for magnetic resonance imaging comprising a set of loops fitting together to define a surface to couple with magnetic flux passing through the surface. Each loop includes a conductor for independently communicating a signal between the loop and an MRI machine, as is typical with phased array coils, and each loop is radially asymmetric about a normal to the surface of the loop to provide improved uniformity of coupling between the loops and the magnetic flux passing through the surface.

Thus, it is one object of the invention to provide a method of reducing variations in sensitivity over a surface covered by phased array loops.

The loops may be arranged about a center of the surface and the asymmetry of the loops may cause the center of gravity of an area enclosed by each loop to be displaced toward the center.

It is thus another object of the invention to overcome a difficulty particularly occurring in symmetric phased array coils where there is considerable falloff toward the center of the coils where each of the coils abuts and such as may cause a loss of signal in clinically important areas.

The loops may be N sided polygons where N is an odd number greater than or equal to five.

Thus, it is another object of the invention to provide a simple method of introducing asymmetry through the use of irregular polygon coils.

The loops may be arranged in columns and rows with the rows extending along an axis of a polarizing magnetic field of the MRI machine and the loops may overlap with loops in adjacent columns and not with loops in adjacent rows.

Thus it is another object of the invention to augment the loop asymmetry of the present invention with an overlapping of the loops, the latter overcoming loss of sensitivity caused by insensitivity of the loop conductors, near the loop conductors, to surface normal flux. This is not a problem for loops positioned transversely with respect to the $B_0$ field where surface parallel flux is present and may be detected.

The loops may be flexible conductors and the phased array coil may conform to an arched space admitting a patient.

It is thus another object of the invention to provide a method of adjusting the sensitivity of loops in a phased array coil that may be particularly useful for flexible coils that conform to a non-planar shape.

These particular objects and advantages may apply to only some embodiments falling within the claims and thus do not define the scope of the invention.

DETAILED DESCRIPTION OF THE PREFERRED EMBODIMENT

Figure 1:
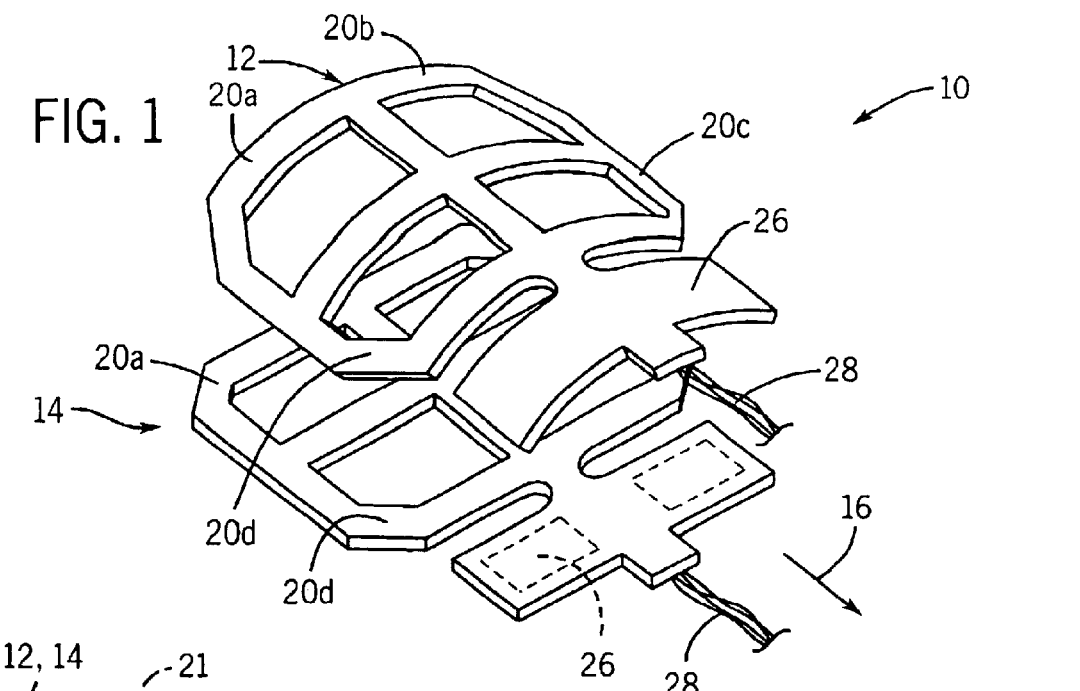
FIG. 1 is a perspective view of a torso coil constructed according to the present invention with two phased array sets, each having four loops, where each loop has a center-shifting asymmetry.

Referring now to FIG. 1, a phased array torso coil 10 includes an upper phased array unit 12 and a lower phased array unit 14 being mirror images of one another about a horizontal plane separating them.

Generally, the lower phased array unit 14 may lay flat or nearly flat along a patient table (not shown) while the upper phased array unit 14 may curve about an axis 16 parallel to and aligned with the surface of patient table and the polarizing magnetic field of the MRI machine to drape about the sides of the patient's torso for better coverage.

Figure 2:
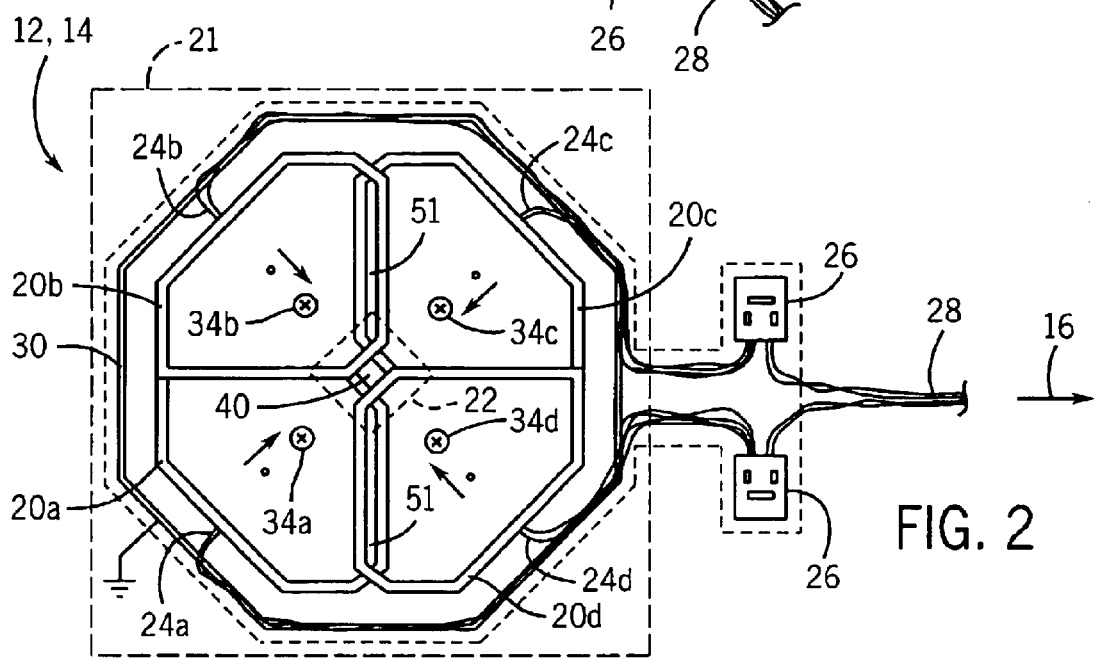
FIG. 2 is a top plan view of one of the phased array sets of FIG. 1 showing the conductor pattern, such as produces the asymmetric loop, together with the routing of independent conductors from each loop along a ground ring to preamplifier units providing decoupling.

Referring now to FIGS. 1 and 2, each of the upper phased array unit 12 and lower phased array unit 14 may include four phased array loops 20a, 20b, 20c, and 20d. Loops 20a and 20c, and loops 20a and 20d, are arranged each in adjacent rows extending along the axis 16. As such, loops 20a and 20b form a perpendicular first column and coil 20d and 20c form a perpendicular second column to fit within rectangular area 21.

Each of the loops 20a–20c comprises a conductor, such as copper foil on a flexible printed circuit board substrate, such as may be encased in a soft flexible protective material, such as fabric or foam to fit comfortably against a patient. As is generally understood in the art, the conductors are tuned to a resonance of the NMR signal by the use of series capacitances (not shown) and are decoupled from one another by preamplifier decoupling reducing current flow in the loops or by a capacitive decoupling network 22 of a type as is described in U.S. co-pending application Ser. No. 10/303, 586 entitled: Decoupling Circuit for Magnetic Resonance Imaging Local Coils, filed Nov. 22, 2002, assigned to the assignee of the present invention and hereby incorporated by reference.

Each of the loops 20a–20d is provided with a separate conductor 24a–24d that communicates an independent NMR signal to a preamplifier circuit 26 attached to the upper phased array unit 12 or lower phased array unit 14. The preamplifier circuit 26 amplifies the signals from the conductor 24a–24d before transmitting them along MRI cables 28 to the MRI machine.

In the preferred embodiment, a conductive grounded ring 30 may circumscribe the four coils 20a–20d, and the cables 24a–24b may be attached to the grounded ring 30 so as to pass to a convenient exit point near the preamplifiers 26 without being subjected to coupling magnetic fields, such as may introduce interference into the MRI signal.

Referring still to FIG. 2, each of the loops 20a–20d is asymmetric about an axis normal to the surface over which they lie (the normal being perpendicular to the sheet on which FIG. 2 is drawn). What is meant by radially asymmetric is that when the loop is flattened to lie within a plane, there is no point in the loop where each line, for all angles within the plane through the point, intersects the loop at two locations equal distance from the point. In particular outer conductors of each loop 20a–20d near corners of the rectangular area 21 pass diagonally inward away from the corners of the rectangular area 21 turning an otherwise square outline of the loops 20a–20d into a generally 5-sided asymmetric figure.

The result of this asymmetry is to move the centers 34a–34d of each loop 20a–20d (center of gravity) inward toward a center region 40 of the upper phased array unit 12 and a lower phased array unit 14, increasing the sensitivity of the loops 20a–20d to this center region 40 above that which would have been obtained had loops 20a–20d retained their nearly square outlines. The amount of asymmetry may be readily controlled to tailor the signal boost desired in this center region 40.

Referring still to FIG. 2, the loop in adjacent rows (i.e., 20a and 20b, and 20d and 20c) do not overlap, however, the loops in adjacent columns (i.e., 20a and 20d, and 20b and 20c) do overlap at area 51 to overcome a falloff in sensitivity that occurs at the column-to-column interface.

Figure 3:
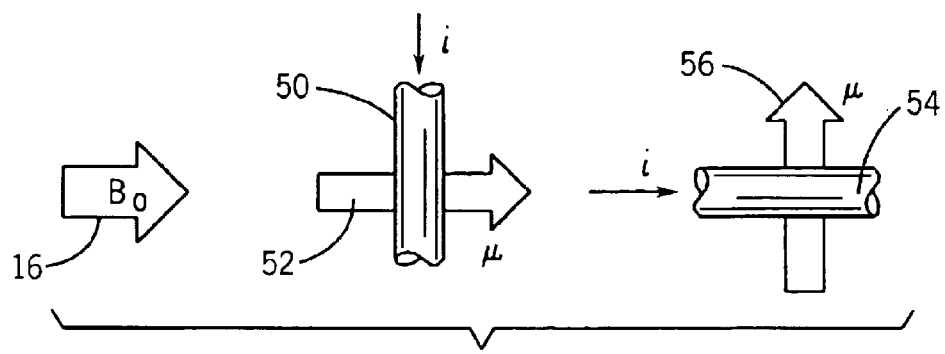
FIG. 3 is a simplified representation of axial and transverse conductors of the loops of FIG. 2 showing a loss of sensitivity of a transverse conductor to surface normal magnetic field as may be overcome by an overlap of the transverse conductors of coils.

Referring to FIG. 3, this falloff occurs because the lines of flux of the NMR signal are largely confined to planes perpendicular to axis 16. Thus, transverse conductor 50 of loops 20a–20d (running perpendicular to axis 16) are blind to the NMR signals directly below the transverse conductor 50, being sensitive principally to axial magnetic fields 52 (by the right hand rule). Overlap of transverse conductors 50 moves these dead areas into a region of sensitivity of the adjacent loop 20a–20d, ensuring that there is no dead area.

Conversely, axial conductors 54 of loops 20a–20d (running parallel to axis 16) are sensitive to the principally transverse magnetic fields 56 produced by the NMR signals. Overlap here is not necessary and would only increase undesirable coupling.

Thus through a combination of asymmetry shifting inward the center of gravity of the coils to regions of low signal strength, and selective overlap, a more uniform phased array coil may be obtained.

It is specifically intended that the present invention not be limited to the embodiments and illustrations contained herein, but include modified forms of those embodiments including portions of the embodiments and combinations of elements of different embodiments as come within the scope of the following claims.

I claim:

1. A phased array local coil for magnetic resonance imaging comprising:

a set of loops fitting together to define a surface to couple with magnetic flux passing through the surface;

wherein each loop includes a conductor for independently communicating a signal between the loop and an MRI machine; and wherein each loop is radially asymmetric about a normal to the surface at the loop the asymmetry selected to provide improved uniformity among the loops of magnetic flux coupling over the surface.

2. The local coil of claim 1 wherein the loops are arranged about a center of the surface and wherein the asymmetry of the loop causes a center of gravity of an area enclosed by each loop to be displaced toward the center of the surface.

3. The local coil of claim 1 wherein the loops are N-sided polygons where N is a number greater than or equal to five.

4. The local coil of claim 1 wherein the loops are arranged in columns and rows with the rows extending along an axis of a polarizing magnetic field of the MRI machine and wherein the loops overlap with loops in adjacent columns and do not overlap with loops in adjacent rows.

5. The local coil of claim 4 wherein there are four loops arranged in two columns and two rows.

6. The local coil of claim 4 wherein the overlap is insufficient to decouple the loops by flux sharing.

7. The local coil of claim 4 further including decoupling circuitry electrically isolating the loops from each other.

8. The local coil of claim 1 wherein the loops are flexible conductors and wherein the phased array coil may conform to an arched space admitting a patient.

9. The local coil of claim 1 having in addition a second phased array local coil of corresponding construction aligned with the phased array local coil to define therebetween a volume that may receive a patient.

10. The local coil of claim 1 further including a grounded ring circumscribing the set of loops and wherein the conductors attached to the grounded ring to follow the grounded ring to a common exit point.

11. A local coil for magnetic resonance imaging comprising:

a set of four loops fitting together in two rows and two columns to cover a generally rectangular surface receiving magnetic flux, wherein portions of the loops at the corners of the rectangular surface cut across the corners to produce an asymmetry in each loop moving the center of gravity of each loop toward the center of the surface;

whereby the coupling of each coil to magnetic flux near the center of the surface is increased.

12. The local coil of claim 11 wherein rows may extend along an axis of a polarizing magnetic field of the MRI machine and wherein the loops overlap with loops in adjacent columns and not with loops in adjacent rows.

13. The local coil of claim 11 wherein each loop includes a conductor for independently communicating a signal between the loop and an MRI machine.

14. The local coil of claim 11 further including a grounded ring circumscribing the set of loops and wherein the conductors are attached to the grounded ring to follow the grounded ring to a common exit point.

15. The local coil of claim 11 further including a decoupling circuit selected from the group consisting of: a capacitive decoupling circuit and a preamplifier decoupling circuit.

* * * * *